(12) United States Patent
Caporaso et al.

(10) Patent No.: US 7,893,541 B2
(45) Date of Patent: Feb. 22, 2011

(54) OPTICALLY INITIATED SILICON CARBIDE HIGH VOLTAGE SWITCH

(75) Inventors: George J. Caporaso, Livermore, CA (US); Stephen E. Sampayan, Manteca, CA (US); James S. Sullivan, Livermore, CA (US); David M. Sanders, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 1137 days.

(21) Appl. No.: 11/586,468

(22) Filed: Oct. 24, 2006

(65) Prior Publication Data

US 2007/0092812 A1 Apr. 26, 2007

Related U.S. Application Data

(60) Provisional application No. 60/730,161, filed on Oct. 24, 2005, provisional application No. 60/798,016, filed on May 4, 2006.

(51) Int. Cl.
*H01L 23/48* (2006.01)
*H01L 23/52* (2006.01)
*H01L 29/40* (2006.01)

(52) U.S. Cl. .......................... 257/778; 257/82; 257/433

(58) Field of Classification Search ............. 257/80–82, 257/431–433, 777–782
See application file for complete search history.

(56) References Cited

U.S. PATENT DOCUMENTS 5,341,017 A   8/1994   Booth et al.
6,759,668 B2 *  7/2004   Matsuo et al. .............. 250/551

OTHER PUBLICATIONS

Steven Sampayan et al, "High Gradient Insulator Technology for the Dielectric Wall Accelerator", LLNL.
A. Neuber et al, "Electric Current in DC Surface Flashover in Vacuum", Journal of Applied Physics vol. 85, No. 6 Mar. 15, 1999 American Institute of Physics pp. 3084 3091.
W.C. Nunnally et al, "Methods and Configurations for Improving Photo-Conductive Switch Performance" 2002 IEEE pp. 183-186.
Steven Sampayan et al "Optically Induced Surface Flashover Switching for the Dielectric Wall Accelerator" 1996 IEEE pp. 2123-2125.
W.C.Nunnally et al High Electric Field, High Current Packaging of SIC Photo-Switches 2005 IEEE UCRL-Conf-212630.
S. Dogan et al "4H-SIC Photoconductive Switching Devices for use in High-Power Applications" Applied Physics Letters vol. 82 No. 18, May 5, 2003 pp. 3107-3109.
W.C. Nunnally et al, "Opportunities for Employing Silicon Carbide in High Power Photo-Switches" MP-46 10277.
Rahul Gunda "Performance Analysis of High Power Photoconductive Switch at Elevated Temperature" Jul. 2005 85 pages.

* cited by examiner

*Primary Examiner*—Zandra Smith
*Assistant Examiner*—Telly D Green
(74) *Attorney, Agent, or Firm*—James S. Tak (57) ABSTRACT

An improved photoconductive switch having a SiC or other wide band gap substrate material, such as GaAs and field-grading liners composed of preferably SiN formed on the substrate adjacent the electrode perimeters or adjacent the substrate perimeters for grading the electric fields.

35 Claims, 7 Drawing Sheets

OPTICALLY INITIATED SILICON CARBIDE HIGH VOLTAGE SWITCH

I. REFERENCE TO PRIOR APPLICATIONS

This application claims the benefit of U.S. Provisional Application No. 60/730,161, filed Oct. 24, 2005, and U.S. Provisional Application No. 60/798,016, filed May 4, 2006, all of which are incorporated by reference herein.

The United States Government has rights in this invention pursuant to Contract No. W-7405-ENG-48 between the United States Department of Energy and the University of California for the operation of Lawrence Livermore National Laboratory.

II. FIELD OF THE INVENTION

The present invention relates to photoconductive switches and more particularly to an optically initiated silicon carbide (SiC) high voltage switch.

III. BACKGROUND OF THE INVENTION

Particle accelerators, such as for example dielectric wall accelerators (DWA), are critically dependent upon high voltage, high current, fast closing switches that can be activated with nanosecond precision. Photoconductive switches offer the most potential in terms of handling such high voltages and high currents with minimum inductance, rapid closure, precise temporal control and the possibility of long life. Photoconductive switching is a technique where optical energy is applied to a semiconductor material, and the optical energy creates carriers within the semiconductor which renders it conductive.

The materials that have been used to date for photoconductive switch applications include Silicon and Gallium Arsenide (GaAs). The difficulty with these materials is that various failure mechanisms occur even at modest parameters. Further, the optical absorption depth for these materials is low, thus the carriers are forced to flow in a very thin area of the material bulk just below the surface. Thus, the principal issue with photoconductive switching has been short lifetime resulting from overstressing current and voltage conditions.

Additionally, silicon carbide (SiC) has long been a promising alternative candidate for use as a photoconductive switch material. It is only very recently, however, has this particular material been made commercially available in sizes and purity that merit application as a high voltage switch. SiC material has high dielectric breakdown strength greater than that of most solid materials (~4 MV/cm), has high thermal conductivity (comparable to that of copper), and low optical absorption. Thus with the availability of single crystalline Silicon Carbide, a new class of switches is possible.

Figure 1:
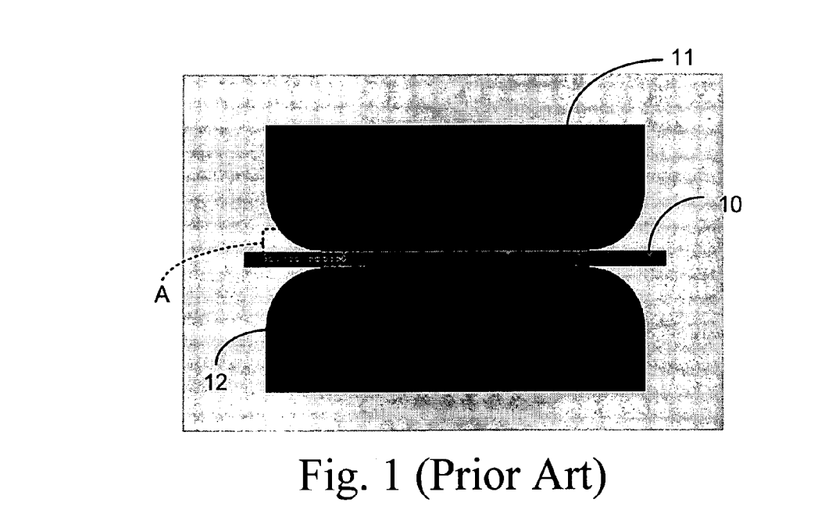
FIG. 1 is a side view of SiC photoconductive switch known in the art.
Figure 2:
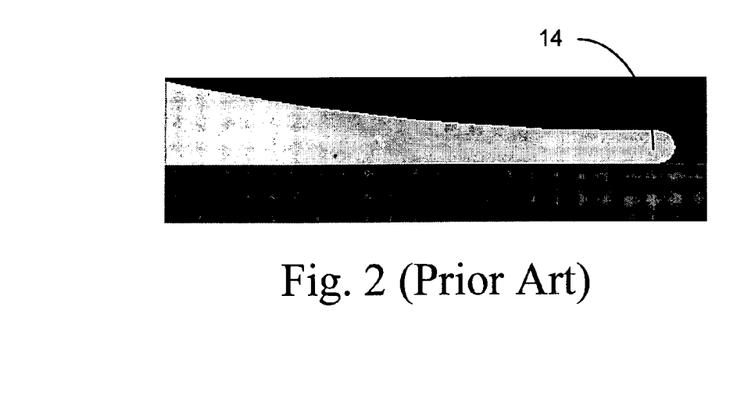
FIG. 2 is an enlarged side view of box A in FIG. 1 illustrating the meniscus formed at the triple point.
Figure 3:
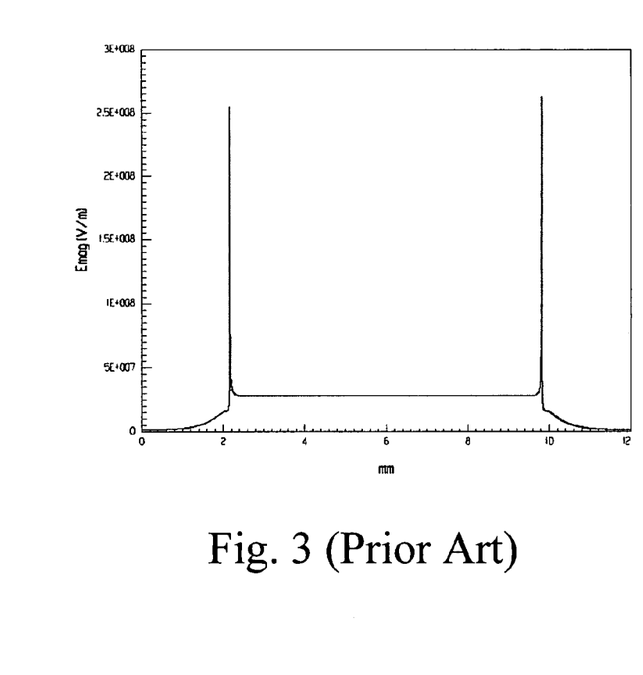
FIG. 3 is a graph showing the magnitude of the electric field along the interface of the SiC substrate and metal coating.
Figure 4:
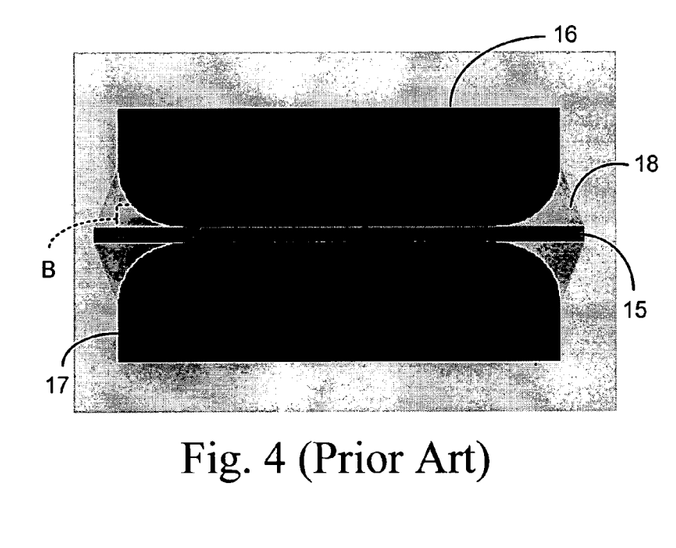
FIG. 4 is a side view of SiC photoconductive switch known in the art and similar to FIG. 1, and having a high permittivity insulator filling the space at the perimeter of the electrodes.
Figure 5:
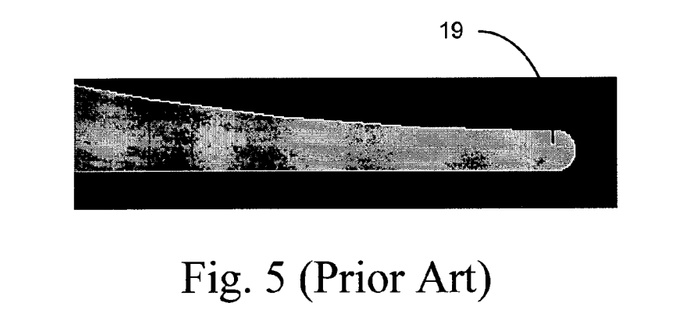
FIG. 5 is an enlarged side view of box B in FIG. 4 illustrating the meniscus formed at the triple point, now including the insulator.
Figure 6:
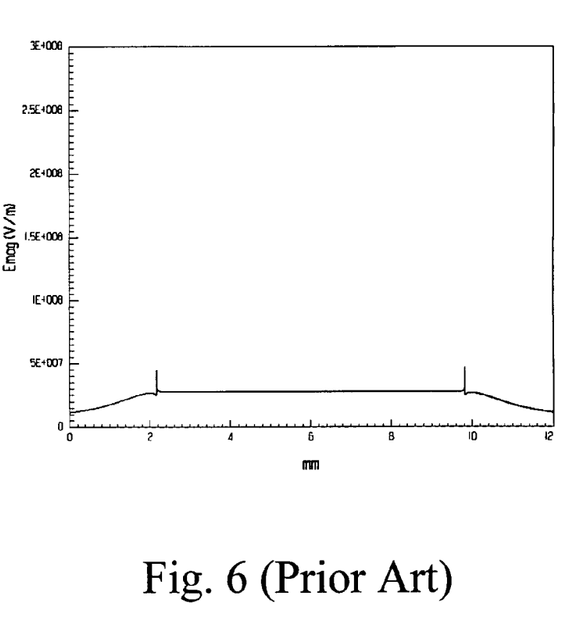
FIG. 6 is a graph showing the magnitude of the electric field along the interface of the SiC substrate, metal coating, and high permittivity insulator.

While promising, even SiC is subject to failure due to high electric fields locally produced where the electrodes separate from contact with the photoconductive substrate. FIG. 1 shows a photoconductive switch known in the art having a SiC photoconductive substrate 10 and two opposing electrodes 11 and 12. FIG. 2 shows an enlarged view of the box A in FIG. 1 showing the meniscus formed at the metal contact between the electrode and substrate surfaces. FIG. 3 shows the magnitude of the electric field on the contact surfaces, and illustrating the spike in magnitude at the triple points. Various methods have been employed to reduce and minimize these fields at such "triple points," such as including filling the space between the electrode and substrate with a high permittivity material. This is shown in FIGS. 4-6. Similar to FIG. 1, FIG. 4 shows a SiC substrate 15 and two electrodes 16 and 17. Additionally, a high permittivity insulator 18 is filled into the space between the separation of the electrodes from the substrate. The meniscus 19 is shown in FIG. 5 at the triple point, where the triple point now includes the insulator material 18. FIG. 6, however, shows that there is still a spike, albeit with less magnitude, at the triple point of electrode-substrate separation.

What is needed therefore is a photoconductive switch for high voltage applications such as for particle accelerators, preferably implemented with a SiC material or other photoconductive materials, such as GaAs, that minimizes or at least reduces the high magnitude electric fields at the points of electrode-substrate separation.

IV. SUMMARY OF THE INVENTION

One aspect of the present invention includes a photoconductive switch comprising: a photoconductive substrate composed of a greater-than-1.6 eV wide band gap material, said substrate having two opposing concavities, and a facet optically connectable to an optical source for receiving optical energy therefrom; and two electrodes having convex surfaces contactedly seated in the two concavities, for applying a potential across the substrate.

Another aspect of the present invention includes a photoconductive switch comprising: a photoconductive substrate composed of a greater-than-1.6 eV wide band gap material, said substrate having opposing electrode-contacting surfaces and a facet optically connectable to an optical source for receiving optical energy therefrom; two electrodes electrically connected to the electrode-contacting surfaces of the substrate, for applying a potential across the substrate; and two field-grading liners formed on the substrate surrounding the electrode-contacting surfaces, for grading the electric fields therealong.

V. BRIEF DESCRIPTION OF THE DRAWINGS

The accompanying drawings, which are incorporated into and form a part of the disclosure, are as follows.

VI. DETAILED DESCRIPTION

Figure 7:
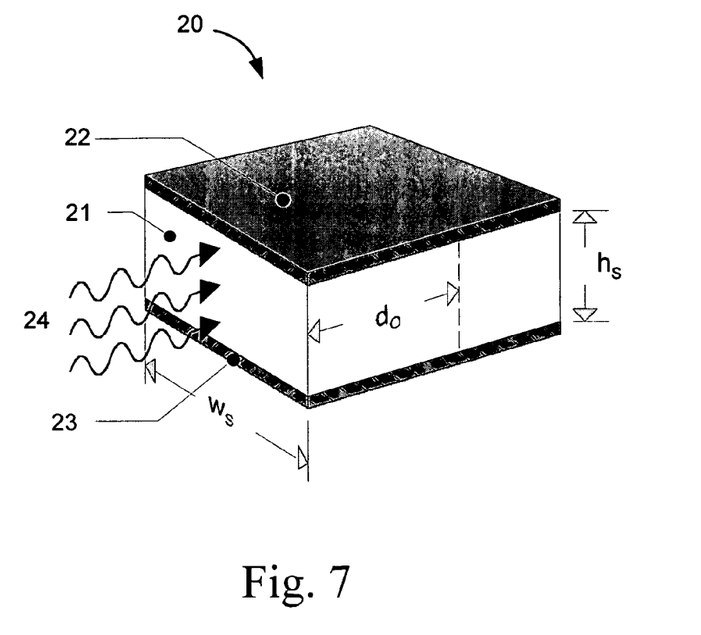
FIG. 7 is a perspective view of a basic photoconductive switch.

The photoconductive switch of the present invention improves upon the basic photoconductive switch construction and operation shown in FIG. 7, with enhancements enabling the switch to handle high voltages and high currents with minimum inductance, rapid closure, precise temporal control and the possibility of long life. As such, the photoconductive switch of the present invention shares much the same construction as a basic photoconductive switch shown in FIG. 7 generally having a photoconductive material 21 between two electrodes 22 and 23. Without optical energy injection, i.e. in the dark, the photo-conductive material is an insulator with a large resistance value (much larger than the circuit impedance) and thus the switch essentially blocks current flow. When optical energy is injected and absorbed in the photoconductive material, the switch resistance drops to a small value (much less than the circuit impedance) and the switch conducts current. Thus the basic photoconductive switch is essentially an optically controlled resistance. The availability of relatively small pulsed lasers or other optical sources enable the injection of optical energy in a short pulse so that the switching time between large blocking resistance and small conduction resistance can easily be several nanoseconds.

There are several physical embodiments or geometries of photoconductive switches one of which is illustrated in FIG. 7, in which the contacts or electrodes are placed in relation to the semiconductor material. The geometry of the switch (electrodes and semiconductor material) is determined by the method in which the optical energy is applied to the switch and the mode of photoconductivity employed in switch operation. The mode of photo-conductivity, intrinsic or extrinsic, is dependent upon the ratio of the photon energy to the band gap energy in the semiconductor. In an intrinsic photo-conductor, the photon energy is greater than the semiconductor band gap energy. In the intrinsic case, the optical absorption depth or the depth, which the optical energy can penetrate, is very small and on the order of tens of microns. In the extrinsic mode, the photon energy is less than the band gap energy of the semiconductor and the optical energy can penetrate to much large depths, dependent upon the active dopant and defect densities in the semiconductor.

These two modes of photoconductivity are further operated in linear and non-linear switch systems. In a linear photoconductive switch, each absorbed photon produces one electron and one electron vacancy or hole, referred to as an electron-hole pair. The electron and hole density is made sufficient to reduce the switch resistance to the desired conduction value by injecting sufficient optical energy. Furthermore, the rate at which the switch closes is dependent upon the rate at which the optical energy is injected into the switch volume such that the closure time is approximately equal to the optical pulse width. The current density in a linear photoswitch is determined by the distribution of the optical energy in the switch volume.

In the present invention, the linear, extrinsic mode of operation is preferred because the optical absorption depth and thus the dimensions of the conducting cross section can be tailored by the controlling the density of interband dopants. However, the inventions is not limited only to such. The density of interband dopants also determines the maximum density of current carriers (electrons and holes) and thus current density at which conduction is possible (the current density is self limiting if the linear mode of operation). The linear mode of operation requires that each current carrier pair be produced by a photon and does not rely on internal avalanche processes that have shown to produce extremely dense current filaments that damage contacts and bulk materials.

Preferably, the photoconductive switch of the present invention uses compensated, Semi-Insulating Silicon Carbide (CSI-SiC) as the photoconductive substrate, since it is considered the best material for application in high power photo-conductive switch applications. This is due to the following reasons. First, CSI-SiCs very large dielectric strength (3 MV/m) which permits very thin layers to support large voltages (GaAs can only support ~250 kV/cm). CSI-SiC switches require reduced levels of optical closure energy since the required optical closure energy scales as the thickness of the CSI-SiC material. CSI-SiC's large dark resistance ($10^{11}$-$10^{15}$ Ohm-cm) which permits low rates of voltage application or charging (maximum GaAs resistivity ~$10^9$ Ohm-cm). CSI-SiC's large thermal conductivity which permits high average power operation without thermally induced conduction (GaAs thermal conductivity is only 10% of SiC). And the compensated nature of CSI-SiC's enables the design of recombination times, optical absorption depths, and thus current densities.

The substrate is a compensated, semi-insulating material selected from a group consisting of 4h SiC, 6h SiC, and GaN. Preferably having a hexagonal crystal structure and cut in a plane selected from the group consisting of the A-Plane, C-Plane and M-plane. With multiple laminated layers so reduce the length of the micropipes. The semi-insulating SiC is preferably doped with at least one of the following dopants: Boron, Vanadium, Nitrogen, Aluminum, Phosphorus, Oxygen, Tungsten and Zinc. And preferably at least one non-electroded facet of the substrate is coated with a dielectric to produce total internal reflection.

Figure 8:
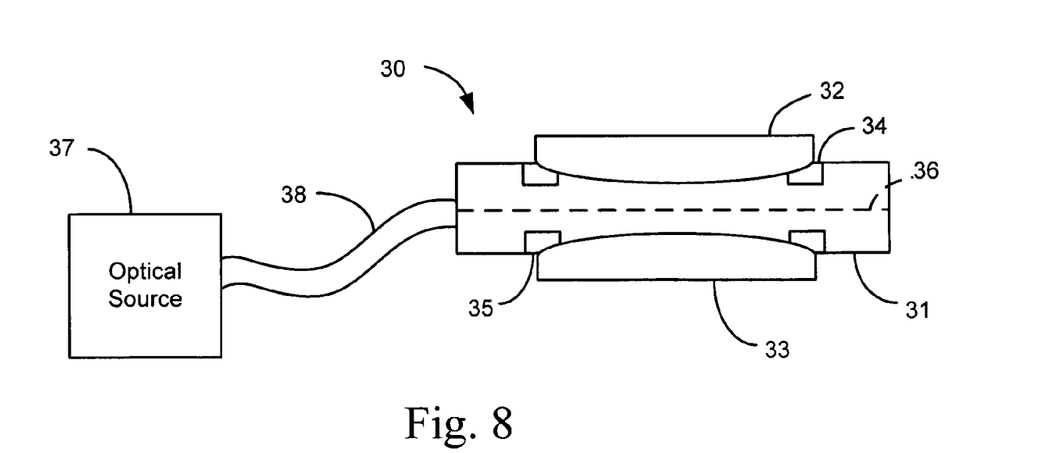
FIG. 8 is a schematic view of an illustrative embodiment of the photoconductive switch of the present invention used in a switching system.

FIG. 8 shows a schematic view of and exemplary embodiment of the photoconductive switch 30 of the present invention, connected to an optical source 37, such as a laser via a optic fiber 38. It includes a photoconductive substrate 31 having two electrodes 32 and 33 (preferably opposing, but not necessary) electrically connected to the substrate. Furthermore, there are field-grading liners 34 and 35 shown formed on the substrate to grade the electric field.

Figure 9:
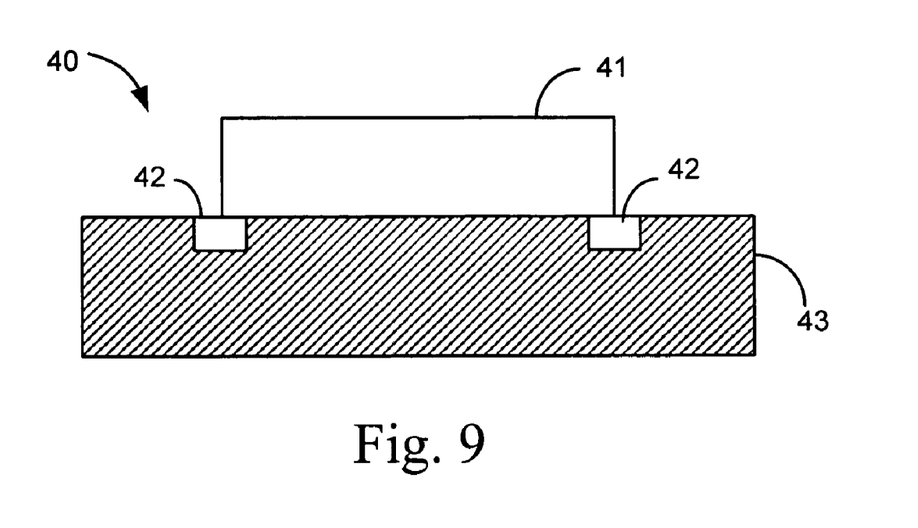
FIG. 9 is a cross-sectional view of an upper half of a first exemplary embodiment of the photoconductive switch of the present invention, showing the electrical connection between an upper electrode and the photoconductive substrate.
Figure 10:
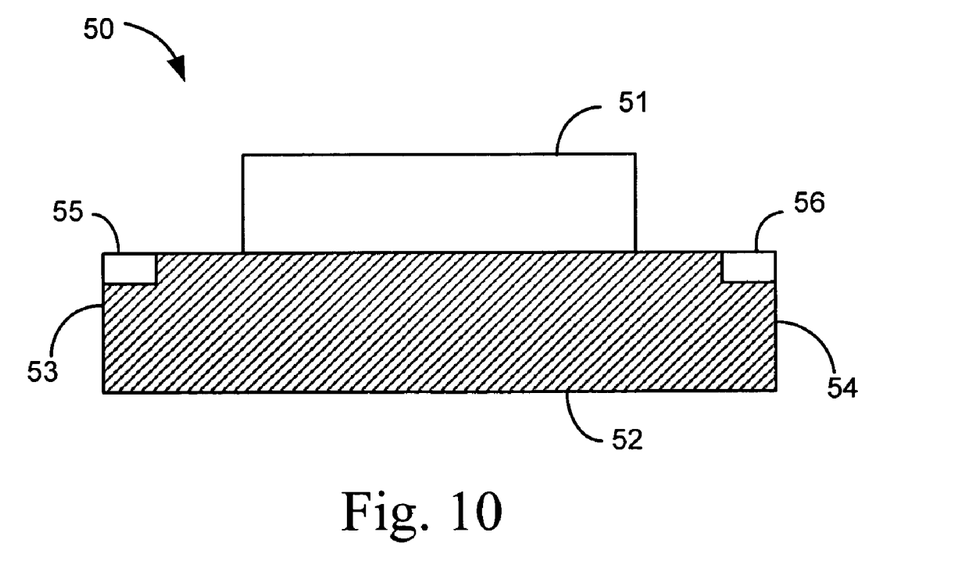
FIG. 10 is a cross-sectional view of an upper half of a second exemplary embodiment of the photoconductive switch of the present invention.
Figure 11:
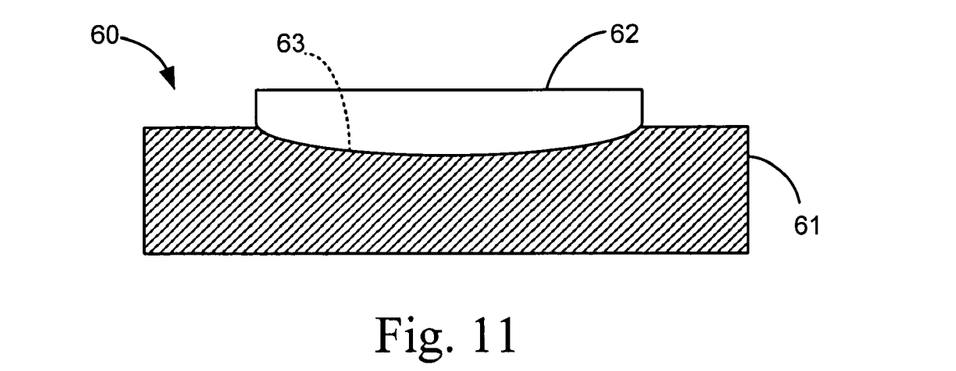
FIG. 11 is a cross-sectional view of an upper half of a third exemplary embodiment of the photoconductive switch of the present invention.
Figure 12:
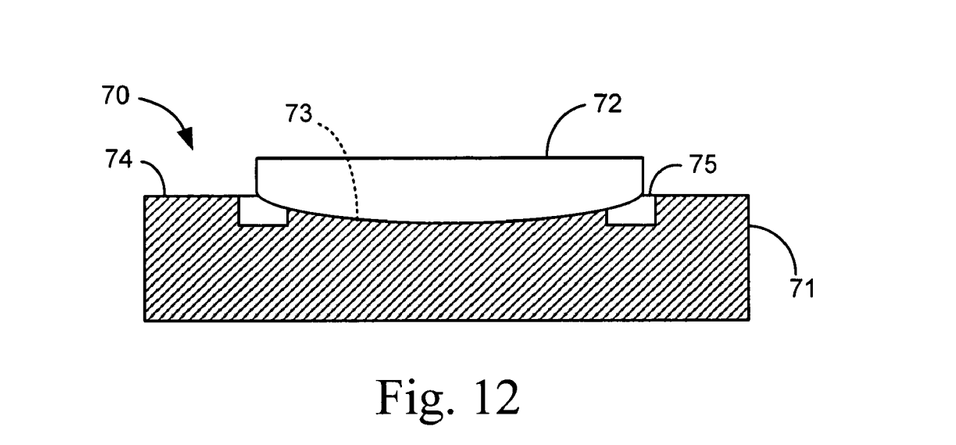
FIG. 12 is a cross-sectional view of an upper half of a fourth exemplary embodiment of the photoconductive switch of the present invention.
Figure 13:
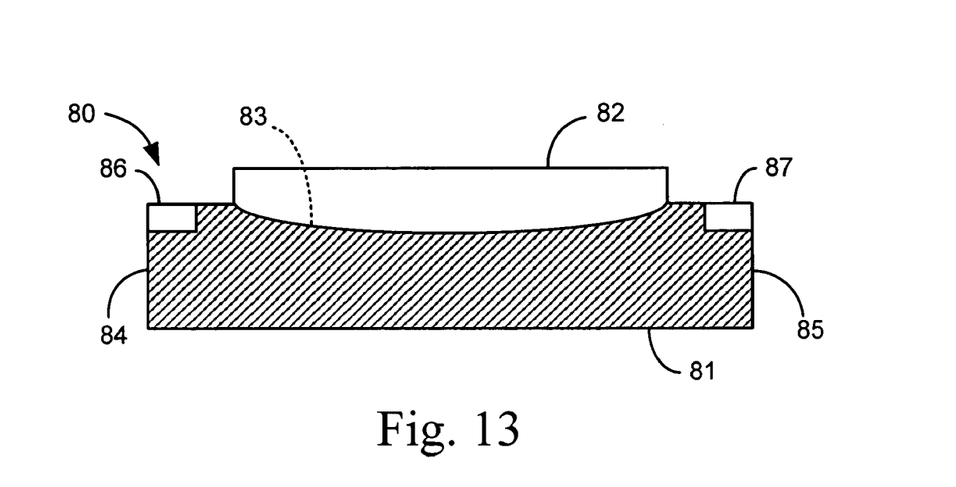
FIG. 13 is a cross-sectional view of an upper half of a fifth exemplary embodiment of the photoconductive switch of the present invention.

FIGS. 9-13 show various embodiments of the electrical connection between the electrodes and an electrode-contacting surface of the substrate (e.g. 63 in FIG. 11). FIG. 9 shows the electrode-contacting surface being a plane and the liners 42 recessed below the substrate. And liners 42 between the substrate and the electrode perimeter. FIG. 10 shows the liners 55, 56 adjacent the substrate perimenter/ends. FIG. 11 shows the electrode-contacting surface having two opposing concavities for seating a convex electrode 62. The electrode-contacting surface 63 is therefore also concave. FIG. 12 shows a similar switch construction of FIG. 11, also including liner 75 between the electrode perimeter and the substrate. And FIG. 13 shows a similar construction as FIG. 12 with the liners adjacent the substrate perimeter.

The photoconductive switch preferably comprises a photoconductive substrate composed of a greater-than-1.6 eV wide band gap material, said substrate having two opposing concavities, and a facet optically connectable to an optical source for receiving optical energy therefrom; and two electrodes having convex surfaces contactedly seated in the two concavities, for applying a potential across the substrate.

Furthermore, at least one field-grading liners formed on the substrate surrounding a corresponding one of the electrode-contacting surfaces, for grading the electric fields therealong. The two field-grading liners are adjacent the electrode perimeters. Also, wherein the two field-grading liners form the rims of the two concavities for grading the electric fields at the separations of the electrodes from the substrate. Preferably the field-grading liners are integrally formed on the substrate.

Preferred material for the field-grading liners are a high permittivity material, or either conductive and semi-conductive materials. Preferably it is composed of silicon nitride. The conductive or semi-conductive material may be formed as a doped sub-surface layer of the substrate, extending into the substrate about 1 micron deep. Optionally, the substrate is a multilayer having at least two photoconductive layers separated by a divider layer, with the divider layer composed of conductive and semi-conductive materials.

Also the photoconductive substrate composed of a greater-than-1.6 eV wide band gap material, said substrate having opposing electrode-contacting surfaces and a facet optically connectable to an optical source for receiving optical energy therefrom; two electrodes electrically connected to the electrode-contacting surfaces of the substrate, for applying a potential across the substrate; and two field-grading liners formed on the substrate surrounding the electrode-contacting surfaces, for grading the electric fields therealong. In the case where the field-grading liners are adjacent the electrode perimeters, the field-grading liners are preferably formed between the substrate and the electrode perimeters. Also, the two field-grading liners are recessed below the level of the electrode-contacting surfaces. Wherein outer surfaces of the field-grading liners are coplanar with the electrode-contacting surfaces to form extensions thereof. Wherein the field-grading liners are adjacent the substrate perimeter.

Figure 14:
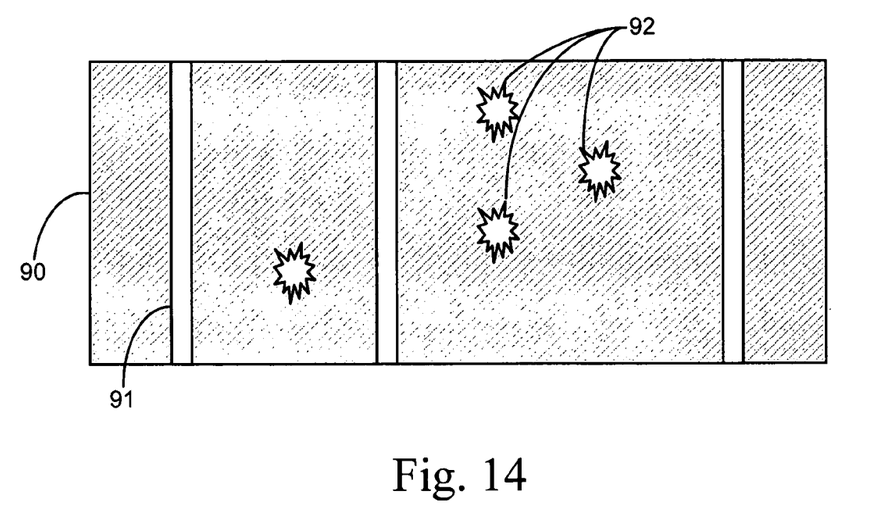
FIG. 14 is a cross-sectional view of a plane of a SiC substrate showing imperfections within the structure such as voids, fractures, and micropipes.

In most substrates, there are imperfection within the structure, such as shown in FIG. 14. These imperfections 92 can include voids, fractures, and the like. In a particular plane of SiC such as shown at 90, these voids can also include "micropipes," such as shown at 91. That is long and narrow tubular voids through the full length of the substrate. When high voltage is applied to the substrate, arc breakdown can occur through the full length of the device either by connecting through the voids or completely through the micropipes. It is well known to those skilled in the art that breakdown occurs in a void by the acceleration and collision of charge particles created within the void by ionization. The collisions create ion-electron pairs which further contribute to the process until a full avalanche i.e., arc occurs. It is also well known that the shorter the charge particles can travel, the less energy they receive, and the less likely an avalanche can occur. Thus small void can have less of an effect than a large void. Eliminating all voids is a difficult and expensive process.

Figure 15:
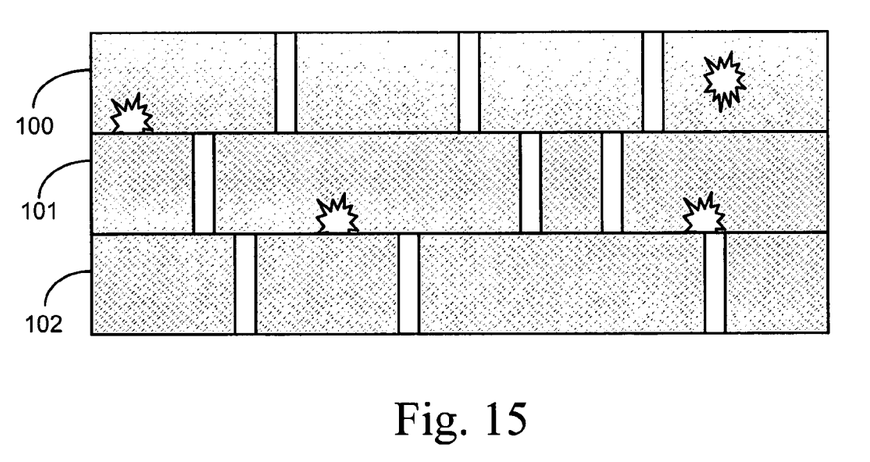
FIG. 15 is a cross-sectional view of a laminated structure of a SiC substrate of the photoconductive switch of the present invention for isolating voids and fractures and preventing micropipes from making a full connection through the entirety of the substrate thickness.

Thus an enhancement for isolating voids and reducing their scale size is shown in FIG. 15 of the present invention. In this structure, the substrate is made into a laminated structure, such as three layers 100-102. Micropipes no longer can make a full connection through the entirety of the substrate thickness. Further, the majority of voids can be made smaller.

Figure 16:
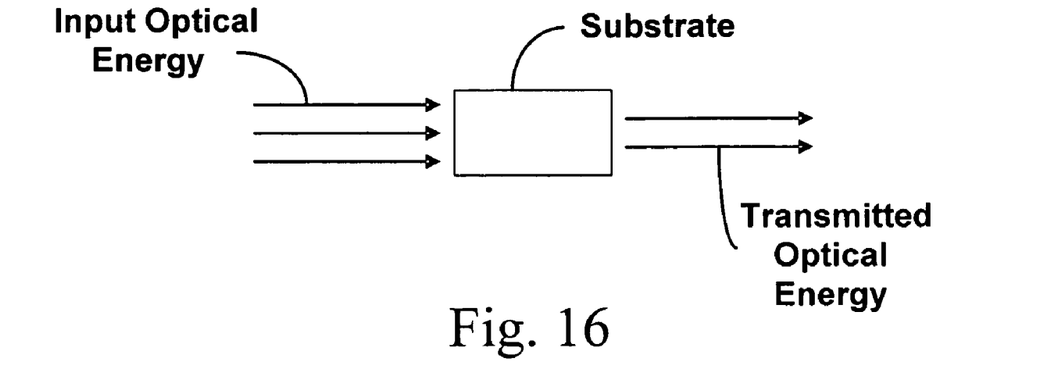
FIG. 16 is a schematic illustration of how substrates are very transparent to the optical energy that is used to transition them from the non-conducting to conducting state, and how input optical energy can be wasted.
Figure 17:
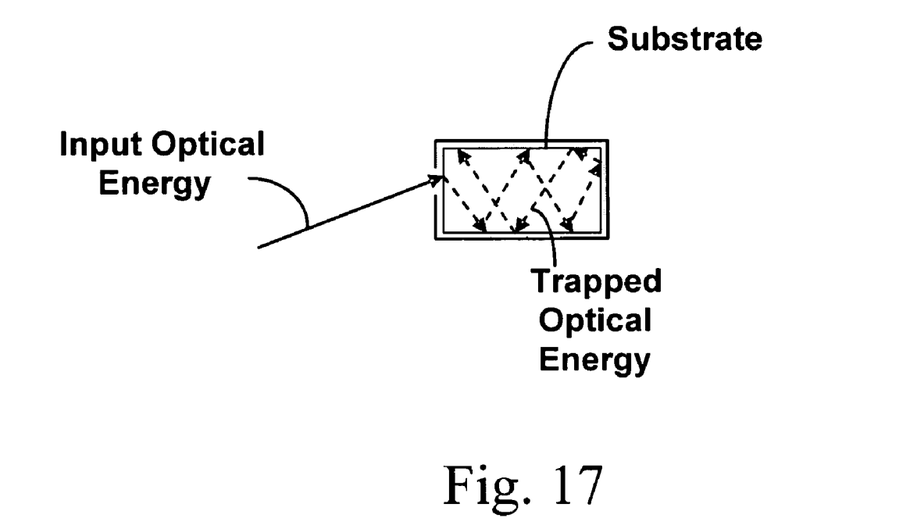
FIG. 17 is a schematic view of an exemplary embodiment of a switch of the present invention having a coating to contain all the admitted optical energy.

Many substrates are very transparent to the optical energy that is used to transition them from the non-conducting to conducting state, as shown in FIG. 16. Optical absorption depths are on the order of 1 cm for approximately 1 micron light. As a result, in an optically short switch, the majority of the input optical energy is wasted. Substrates can be expensive and thus an optically long switch would be expensive to be efficient. As a result, operating a large array of these switches in perhaps an accelerator, could become prohibitive because of cost. As shown in FIG. 17, an exemplary embodiment of the present invention makes the switch into a cavity which contains all the admitted optical energy. This is accomplished by a means, such as a dielectric coating shown in FIG. 17, whereby the substrate scale can be made small and optimization of the device size can be focused on the electrical requirements such as current density through the switch.

An example fabrication process for integrally forming the field-grading liners in a 6H—Sic substrate, for example, is as follows. First RCA clean 6H—SiC substrates. Then plasma-enhanced chemical vapor deposition or PECVD growth at 350 C of 0.5 um Silicon Nitride layer over surface of 6H—SiC substrates. High temperature (1200 C) growth of 1 um thick thermal oxide ($SiO_2$) layer over surface Nitride layer. Reactive ion etch through $SiO_2$ and $Si_3N_4$ layers and approximately 1-2 um into 6H—SiC substrate surface. Reactive ion etch using $SF_6$-$O_2$ gas will result in a radiused profile at the edge of the pattern etched through $SiO_2$, $Si_3N_4$ and into SiC. Next, contact metal layers are deposited directly over etched pattern such that the high fields at the edge of metalization are pushed into thermal $SiO_2$ layer. Thermal oxide layer has a critical field strength three times higher than 6H—SiC.

It is appreciated that RCA clean is the industry standard for removing contaminants from wafers. Contaminants present on the surface of silicon wafers at the start of processing, or accumulated during processing, have to be removed at specific processing steps in order to obtain high performance and high reliability semiconductor devices, and to prevent contamination of process equipment, especially the high temperature oxidation, diffusion, and deposition tubes. The RCA cleaning procedure has three major steps used sequentially: First there is organic cleaning involving the removal of insoluble organic contaminants with a 5:1:1 $H_2O:H_2O_2$:$NH_4OH$ solution. Next there is oxide stripping involving the removal of a thin silicon dioxide layer where metallic contaminants may accumulated as a result of (I), using a diluted $H_2O$:HF solution. And finally, there is ionic cleaning involving the removal of ionic and heavy metal atomic contaminants using a solution of 6:1:1 $H_2O:H_2O_2$:HCl.

While particular operational sequences, materials, temperatures, parameters, and particular embodiments have been described and or illustrated, such are not intended to be limiting. Modifications and changes may become apparent to those skilled in the art, and it is intended that the invention be limited only by the scope of the appended claims.

We claim:

1. A photoconductive switch comprising,
a photoconductive substrate composed of a greater-than-1.6 eV wide band gap material, said substrate having at least one concavity(s), and a facet optically connectable to an optical source for receiving optical energy therefrom;
two electrodes electrically connected to the substrate with at least one of the electrodes having a convex surface contactedly seated in a corresponding one of the at least one concavity(s), for applying a potential across the substrate; and
two field-grading liners formed on the substrate surrounding the electrode-contacting surfaces, for grading the electric fields therealong.

2. The photoconductive switch of claim 1,
wherein the two field-grading liners are adjacent the electrode perimeters.

3. The photoconductive switch of claim 2,
wherein the two field-grading liners form the rims of the two concavities for grading the electric fields at the separations of the electrodes from the substrate.

4. The photoconductive switch of claim 1,
wherein the field-grading liners are integrally formed on the substrate.

5. The photoconductive switch of claim 1,
wherein the field-grading liners are a high permittivity material.

6. The photoconductive switch of claim 1,
wherein the field-grading liners are selected from a group consisting of conductive and semi-conductive materials.

7. The photoconductive switch of claim 6,
wherein the field-grading liners are composed of silicon nitride.

8. The photoconductive switch of claim 6,
wherein the conductive or semi-conductive material is formed as a doped sub-surface layer of the substrate.

9. The photoconductive switch of claim 8,
wherein the doped sub-surface conductive or semi-conductive sub-surface layer extends into the substrate about 1 micron deep.

10. The photoconductive switch of claim 1,
wherein the substrate is a multilayer having at least two photoconductive layers separated by a divider layer.

11. The photoconductive switch of claim 10,
wherein the divider layer is selected from a group consisting of conductive and semi-conductive materials.

12. The photoconductive switch of claim 1,
wherein the substrate is a compensated, semi-insulating material selected from a group consisting of 4h SiC, 6h SiC, and GaN.

13. The photoconductive switch of claim 12,
wherein the substrate is semi-insulating SiC having a hexagonal crystal structure and cut in a plane selected from the group consisting of the A-Plane, C-Plane and M-plane.

14. The photoconductive switch of claim 13,
wherein the substrate comprises at least two layers cut in the C-Plane and offset from each other.

15. The photoconductive switch of claim 12,
wherein the semi-insulating SiC is doped with at least one of the following dopants: Boron, Vanadium, Nitrogen, Aluminum, Phosphorus, Oxygen, Tungsten and Zinc.

16. The photoconductive switch of claim 1,
wherein at least one facet of the substrate is coated with a dielectric to produce total internal reflection.

17. A photoconductive switch comprising:
a photoconductive substrate composed of a greater-than-1.6 eV wide band gap material, said substrate having opposing electrode-contacting surfaces and a facet optically connectable to an optical source for receiving optical energy therefrom;
two electrodes electrically connected to the electrode-contacting surfaces of the substrate, for applying a potential across the substrate; and
at least one field-grading liner(s) formed on the substrate surrounding a corresponding one of the electrode-contacting surfaces, for grading the electric fields therealong.

18. The photoconductive switch of claim 17,
wherein the field-grading liners are adjacent the electrode perimeters.

19. The photoconductive switch of claim 18,
wherein the field-grading liners are formed between the substrate and the electrode perimeters.

20. The photoconductive switch of claim 19,
wherein the two field-grading liners are recessed below the level of the electrode-contacting surfaces.

21. The photoconductive switch of claim 20,
wherein outer surfaces of the field-grading liners are coplanar with the electrode-contacting surfaces to foiln extensions thereof.

22. The photoconductive switch of claim 17,
wherein the field-grading liners are adjacent the substrate perimeter.

23. The photoconductive switch of claim 17,
wherein the field-grading liners are integrally formed on the substrate.

24. The photoconductive switch of claim 17,
wherein the field-grading liners are a high permittivity material.

25. The photoconductive switch of claim 17,
wherein the field-grading liners are selected from a group consisting of conductive and semi-conductive materials.

26. The photoconductive switch of claim 25,
wherein the field-grading liners are composed of silicon nitride.

27. The photoconductive switch of claim 25,
wherein the conductive or semi-conductive material is formed as a doped sub-surface layer of the substrate.

28. The photoconductive switch of claim 27,
wherein the doped sub-surface conductive or semi-conductive sub-surface layer extends into the substrate about 1 micron deep.

29. The photoconductive switch of claim 17,
wherein the substrate is a multilayer having at least two photoconductive layers separated by a divider layer.

30. The photoconductive switch of claim 29,
wherein the divider layer is selected from a group consisting of conductive and semi-conductive materials.

31. The photoconductive switch of claim 17,
wherein the substrate is a compensated, semi-insulating material selected from a group consisting of 4h SiC, 6h SiC, and GaN.

32. The photoconductive switch of claim 31,
wherein the substrate is semi-insulating SiC having a hexagonal crystal structure and cut in a plane selected from the group consisting of the A-Plane, C-Plane and M-plane.

33. The photoconductive switch of claim 32, wherein the substrate comprises at least two layers cut in the C-Plane and offset from each other.

34. The photoconductive switch of claim 31, wherein the semi-insulating SiC is doped with at least one of the following dopants: Boron, Vanadium, Nitrogen, Aluminum, Phosphorus, Oxygen, Tungsten and Zinc.

35. The photoconductive switch of claim 17, wherein at least one facet of the substrate is coated with a dielectric to produce total internal reflection.

* * * * *